(12) United States Patent
Boesen

(10) Patent No.: US 6,664,713 B2
(45) Date of Patent: Dec. 16, 2003

(54) SINGLE CHIP DEVICE FOR VOICE COMMUNICATIONS

(76) Inventor: Peter V. Boesen, 1000 73rd St., Suite 18, Des Moines, IA (US) 50311

( * ) Notice: Subject to any disclaimer, the term of this patent is extended or adjusted under 35 U.S.C. 154(b) by 6 days.

(21) Appl. No.: 10/004,572

(22) Filed: Dec. 4, 2001

(65) Prior Publication Data

US 2003/0103638 A1 Jun. 5, 2003

(51) Int. Cl.$^7$ .............................................. H01L 41/08
(52) U.S. Cl. ...................... 310/328; 181/130; 181/135; 381/312
(58) Field of Search ................................ 310/328, 329; 381/312; 181/130, 135

(56) References Cited

U.S. PATENT DOCUMENTS

| | | | | |
|---|---|---|---|---|
| 4,419,598 A | * | 12/1983 | Spitz et al. | 310/311 |
| 4,849,668 A | * | 7/1989 | Crawley et al. | 310/328 |
| 5,531,787 A | * | 7/1996 | Lesinski et al. | 623/10 |
| 5,692,059 A | * | 11/1997 | Kruger | 381/151 |
| 6,005,955 A | * | 12/1999 | Kroll et al. | 381/328 |
| 6,031,317 A | * | 2/2000 | Chen | 310/329 |
| 6,041,129 A | * | 3/2000 | Adelman | 381/328 |
| 6,094,492 A | | 7/2000 | Boesen | 381/312 |
| 6,128,961 A | | 10/2000 | Haronian | 73/774 |
| 6,243,474 B1 | | 6/2001 | Tai et al. | 381/174 |
| 6,249,075 B1 | | 6/2001 | Bishop et al. | 310/338 |
| 6,301,366 B1 | | 10/2001 | Malcolm, Jr. et al. | 381/119 |

FOREIGN PATENT DOCUMENTS

EP 000533284 A1 * 3/1993 ............ H04R/19/01

OTHER PUBLICATIONS

Measurement Specialties, Inc. "*Piezo Film Sensors*" Technical Manual, Apr. 1999.

Sandia National Laboratories, Intelligent Micromachine Initiative, "*Non–Inertial Sensors*" Bibliography Table, Oct. 2001.

Sandia National Laboratories, "*A New Analytical Solution For Diaphragm Deflection And Its Application To a Surface–Micromachined Pressure Sensor*"; Wm. Eaton, F. Bitsi, J. Smith, D. Plummer, Oct. 2001.

Sandia National Laboratories, Intelligent Micromachine Initiative "*General Reviews*" Bibliography Table, 2001, Oct. 2001.

Sandia National Laboratories, Intelligent Micromachine Initiative, "*Related WWW Links*", "*SUMMIT V Technology*", "*MEMS Overview*", "*SUMMiT Technology*", Oct. 2001.

\* cited by examiner

*Primary Examiner*—Thomas M. Dougherty
(74) *Attorney, Agent, or Firm*—McKee, Voorhees & Sease, P.L.C.

(57) ABSTRACT

The present invention is a chip for use in a voice communication device. The chip provides for both bone conduction sensing and air conduction sensing. The chip includes a bone conduction sensing pattern disposed within the chip and a microphone sensing pattern disposed within the chip. In addition, the chip can optionally include an integrated circuit portion interconnected to the bone conduction sensing pattern and the microphone sensing pattern. The pattern can be of a piezoelectric polymer, the patterns overlaying the substrate. Preferably, the bone conduction sensing pattern and the microphone sensing pattern are placed on opposite ends of the chip.

8 Claims, 4 Drawing Sheets

SINGLE CHIP DEVICE FOR VOICE COMMUNICATIONS

BACKGROUND OF THE INVENTION

This invention relates to a single chip device for voice communications. In particular, this invention relates to a single chip device for voice communications having both a microphone sensor and an accelerometer on the same chip.

The method of combining microphone sensors with bone conduction sensors such as accelerometers has recently been recognized. In particular, U.S. Pat. No. 6,094,492 to Boesen discloses a bone conduction voice transmission apparatus and system having both a microphone sensor and a bone conduction sensor, that may be an accelerometer. In such a voice communications device, both the accelerometer and microphone sensor can be positioned in the external auditory canal of a user. In such an application, there is a need for both small size and low power.

Generally, there have been efforts at reducing the size of accelerometers and microphone sensors. Such devices have been implemented separately as micro electronic mechanical systems. For example, U.S. Pat. No. 6,128,961 to Haronian discloses a microelectronic mechanics system (MEMS) with a deformation sensor. In addition, pressure sensors have been made as well as microphones and other devices.

Despite these recent advances in the art, problems remain.

Therefore, it is a primary object of the present invention to improve upon the state of the art.

It is a further object of the present invention to provide a chip adapted for use in a voice communication earpiece.

Another object of the present invention is to provide a single chip having both an accelerometer and a microphone.

Yet another object of the present invention is to provide a single chip that is also capable of signal conditioning.

A further object of the present invention is to provide a single chip that is capable of manufacturing in large quantities and at low cost.

A further object of the present invention is to provide a bone conduction sensor and microphone sensor that are small in size.

Yet another object of the present invention is to provide a bone conduction sensor and microphone sensor that require low power.

These and other objects, features, or advantages of the present invention will become apparent from the specification and claims.

BRIEF SUMMARY OF THE INVENTION

The present invention is a chip for use in a voice communication device. The chip includes a bone conduction sensing pattern disposed within the chip and a microphone sensing pattern disposed within the chip. Further the chip can include an integrated circuit portion interconnected to the bone conduction sensing pattern and microphone sensing pattern. This integrated circuit portion can include signal conditioning and/or other circuitry. Preferably, the bone conduction sensing pattern is positioned at an opposite end of the chip as the microphone sensing pattern.

The patterns of the chip can be of piezoelectric polymers that overlay a substrate.

Because the present invention provides a single chip with both an accelerometer that can be used as a bone conduction sensor and a microphone sensor, the present invention is adapted for use in a voice communication device which requires both bone conduction sensing and air conduction sensing. Because these devices are placed in the same chip, advantages gained include both low power and reduced size. Further, because the accelerometer and microphone are on the same chip, the resulting device provides for improved differential sensing between that which is sensed by the vibration sensing accelerometer and that which is sensed by the air conduction sensing microphone. This is particularly important in use in a voice communication device which combines or processes both signals from accelerometer as well as signals from the microphone.

DETAILED DESCRIPTION OF THE INVENTION

Figure 1:
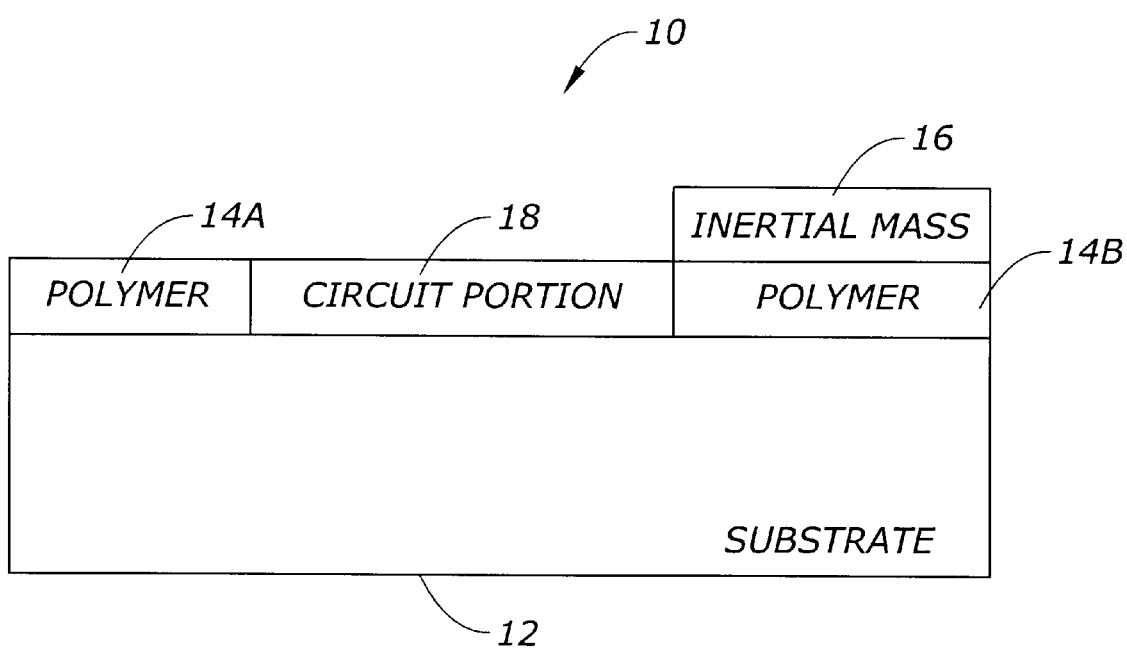
FIG. 1 is a diagram of the chip of the present invention showing the polymer layers overlaying the substrate.

FIG. 1 shows a chip 10 according to the present invention. The chip 10 of the present invention includes a substrate 12. The substrate 12 may be silicon, ceramic, or other substrates such as may be known in the art. Overlaying the substrate 12 is a polymer layer 14. The polymer layer 14 may include a first portion 14A and a second portion 14B. The first portion 14A may be located on an opposite end of the chip 10 as the second portion of the polymer layer 14B. The polymer is preferably a piezoelectric polymer. The polymer portion 14A is patterned to form an air conduction sensor or microphone sensor. The polymer portion 14B is combined with an inertial mass 16 to provide an accelerometer or bone conduction sensing portion. Between the polymer portion 14A and the polymer portion 14B is a circuit portion 18. The circuit portion 18 is constructed according to known manufacturing processes and techniques. The circuit portion 18 can provide signal conditioning circuitry as well as other circuitry. For example, the circuit portion 18 can include one or more field effect transistors (FETs), operational amplifiers, or low current digital logic.

Figure 2:
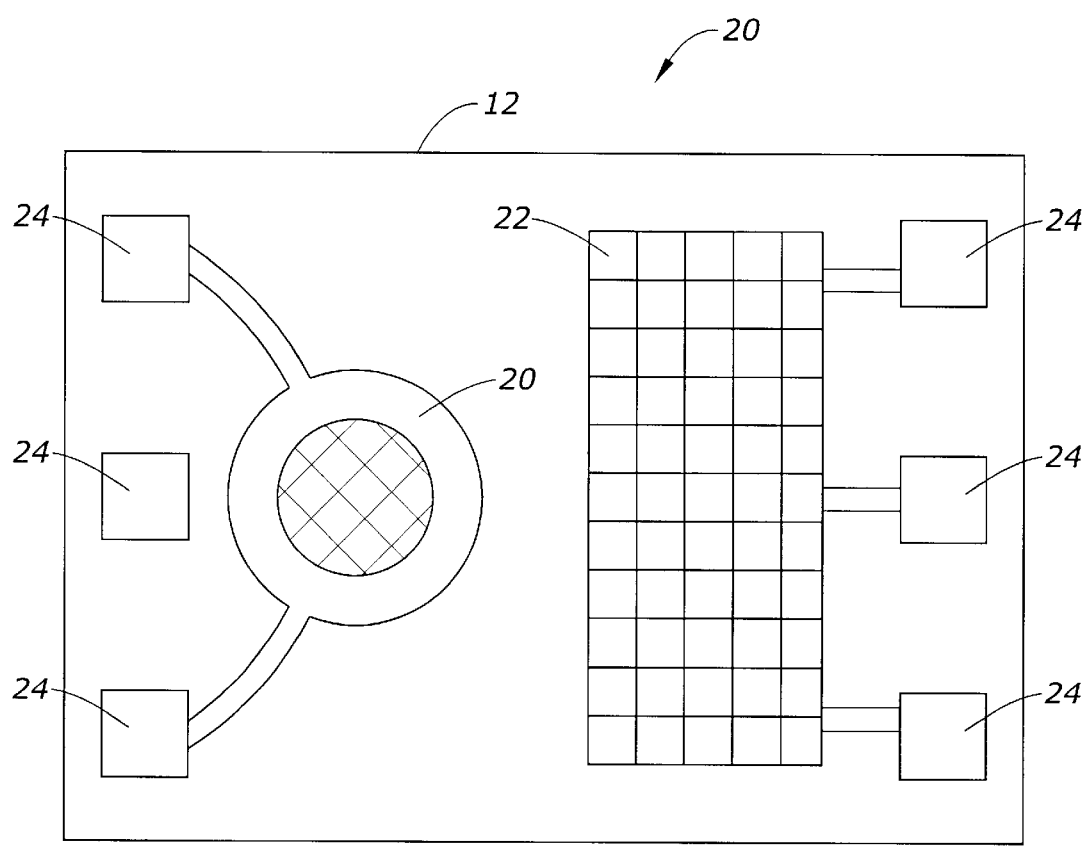
FIG. 2 is a diagram of the chip of the present invention showing both a microphone sensor pattern and a bone conduction sensor pattern.

FIG. 2 provides a diagram showing the patterns used for the microphone sensor portion and the accelerometer sensor portion. The patterns used are merely representative. The present invention contemplates that any number of patterns can be used depending upon the particular application or environment and upon the specific design considerations or constraints that apply. The chip 20 includes the substrate 12, the piezoelectric polymer patterns 20 and 22 overlying the substrate 12. The piezoelectric polymer pattern 20 is that of a microphone element. The piezoelectric pattern 22 is that of an accelerometer, vibration sensor, or bone conduction sensor. Also shown are the terminals 24 for mechanical and/or electrical connection to the rest of an electronic circuit.

Figure 3:
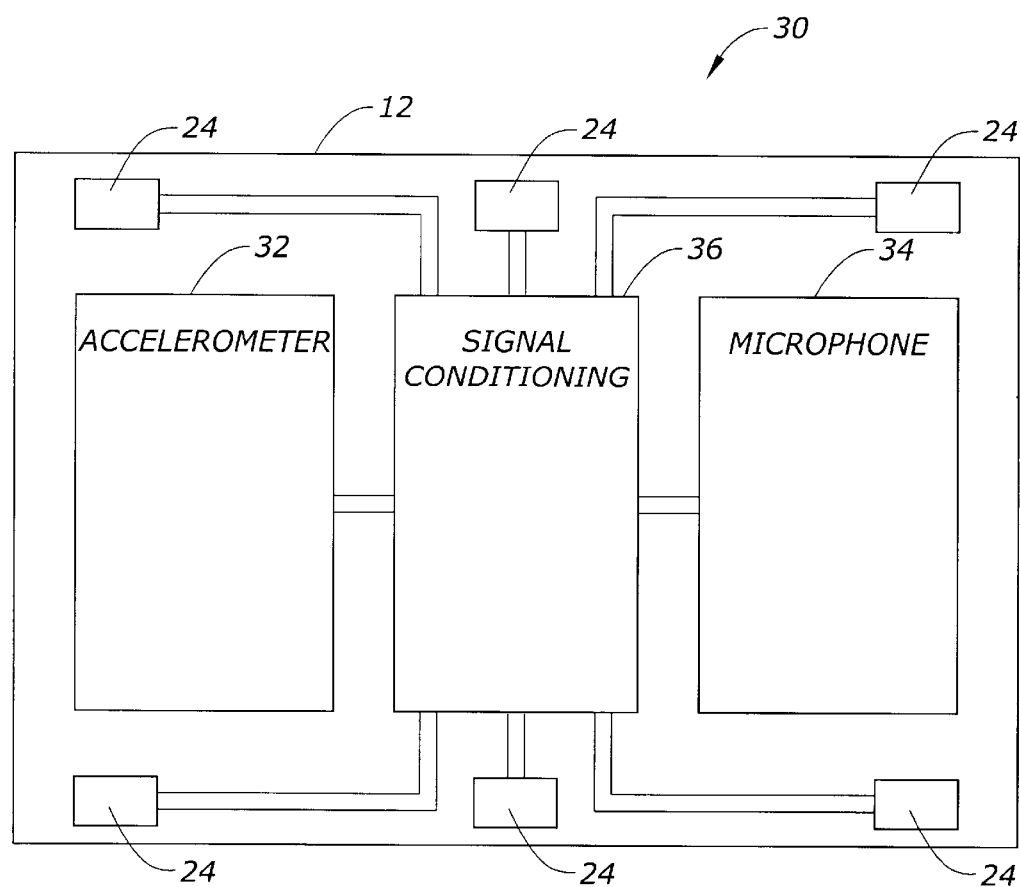
FIG. 3 is a block diagram of the chip according to the present invention showing an accelerometer portion, a signal conditioning portion, and a microphone portion.

FIG. 3 provides a block diagram according to the present invention. The chip 30 shown in FIG. 3 includes an accelerometer portion 32, microphone portion 34, and a signal conditioning portion 36. The accelerometer portion 32 is electrically connected to the signal conditioning portion 36. The microphone portion 34 is electrically connected to the signal conditioning portion 36. The signal conditioning portion 36 is electrically connected to a plurality of connections 24. The electrical connections 24 can be pin connections, pads, or other types of terminals adapted for mechanical and/or electrical connection.

Figure 4:
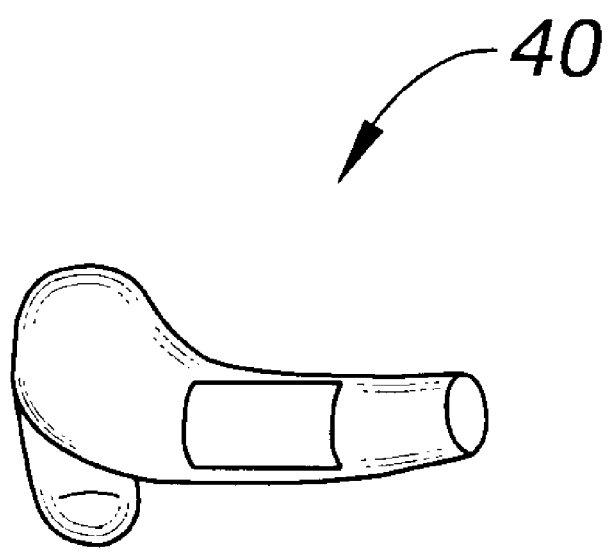
FIG. 4 is a pictorial representation of an earpiece according to the present invention, earpiece having a chip with both a microphone sensor portion and a bone conduction sensor portion.

FIG. 4 shows a pictorial representation of an earpiece 40 of the present invention. The earpiece 40 contains a chip having both a microphone sensor portion and a vibration sensing portion. This allows the earpiece 40 to be small in size while still containing both a bone conduction sensing portion and an air conduction sensing portion. As both the bone conduction sensing portion and ear conduction sensing portion are a part of the same chip, only low power requirements are needed. Further, as the bone conduction sensor and the air conduction sensor are positioned on the same chip, any noise experienced by one of the sensors is more likely to be experienced by the other sensor so that processing of the received sound signals can be improved as both the bone conduction sensor and the air conduction sensor are subjected to the same environmental variations. Thus when processing, when differences are obtained from that which is detected with the air conduction sensor, these differences are less likely to be affected by variations and noise between the two and more likely to merely cancel.

Thus, a single chip air conduction sensing and bone conduction sensing device has been disclosed. The present invention contemplates numerous variations in the placement of the sensors, the signal conditioning circuitry used, the pattern of the accelerometer, the pattern of the microphone sensor, the type of substrate, the type of piezoelectric layer, and other variations. It is not intended that the present invention be limited by the specific embodiments disclosed herein. The present invention should only be limited by the claims that follow.

What is claimed is:

1. A chip for use in a voice communication device comprising:

a bone conduction sensing pattern disposed within the chip; and a microphone sensing pattern disposed within the chip.

2. The chip of claim 1 further comprising an integrated circuit portion interconnected to the bone conduction sensing pattern and the microphone sensing pattern.

3. The chip of claim 1 wherein the bone conduction sensing pattern is positioned on a first end of the chip, the first end opposite a second end of the chip, the microphone sensing pattern positioned on the second end of the chip.

4. A chip for use in a voice communication device comprising:

a substrate;

a piezoelectric polymer overlaying the substrate;

the piezoelectric polymer having a first pattern and a second pattern, the first pattern being an accelerometer sensor pattern and the second pattern being a microphone sensor pattern.

5. The chip of claim 4 further comprising an electronic sensor portion overlaying the substrate.

6. The chip of claim 5 wherein the electronic sensor portion includes a signal conditioning circuit.

7. The chip of claim 4 wherein the piezoelectric polymer is divided into a first portion and a second portion at opposite ends of the chip, the accelerometer sensor pattern defined within the first portion and the microphone sensor pattern defined within the second portion.

8. A voice communication device comprising:

a chip having a microphone sensor and an accelerometer.

* * * * *